US006832348B2

(12) United States Patent
Kawabe et al.

(10) Patent No.: US 6,832,348 B2
(45) Date of Patent: Dec. 14, 2004

(54) SEMICONDUCTOR INTEGRATED CIRCUIT HAVING SELF-DIAGNOSIS TEST FUNCTION AND TEST METHOD THEREOF

(75) Inventors: Atsushi Kawabe, Tokyo (JP); Hideo Miyazawa, Kanagawa (JP); Satoshi Hori, Kanagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 471 days.

(21) Appl. No.: 09/730,817

(22) Filed: Dec. 6, 2000

(65) Prior Publication Data

US 2001/0003196 A1 Jun. 7, 2001

(30) Foreign Application Priority Data

Dec. 7, 1999 (JP) .......................................... P. 11-347746

(51) Int. Cl.[7] .............................................. G01R 31/28
(52) U.S. Cl. ...................................................... 714/733
(58) Field of Search .......................... 714/30, 733, 724, 714/732; 324/760, 765, 73.1; 702/117, 123

(56) References Cited

U.S. PATENT DOCUMENTS

| 4,493,078 A | * | 1/1985 | Daniels ....................... 714/736 |
| 5,051,997 A | | 9/1991 | Sakashita et al. ........... 714/732 |
| 5,144,627 A | | 9/1992 | Horie et al. ................. 714/724 |
| 5,228,139 A | | 7/1993 | Miwa et al. .................. 714/27 |
| 5,617,429 A | * | 4/1997 | Goto ........................... 714/736 |
| 5,638,382 A | * | 6/1997 | Krick et al. ................. 714/733 |
| 5,657,330 A | * | 8/1997 | Matsumoto .................. 714/733 |
| 6,198,663 B1 | * | 3/2001 | Takizawa ................ 365/189.29 |
| 6,324,666 B1 | * | 11/2001 | Nakamoto ................... 714/736 |

FOREIGN PATENT DOCUMENTS

JP          05-180903          7/1993

* cited by examiner

*Primary Examiner*—Shelly A Chase

(57) ABSTRACT

An I/O cell (101) becomes an output state according to a burn-in test mode signal M in a burn-in test and the output of a port output signal setting register (106) is selected in an output signal selecting circuit (105). An instruction for periodically alternately setting "H" and "L" in the port output signal setting register (106) is written in test ROM (103). According to this circuit configuration, in burn-in, "H" and "L" are alternately output from the I/O cell (101) and appropriate stress can be applied to the I/O cell (101).

8 Claims, 4 Drawing Sheets

SEMICONDUCTOR INTEGRATED CIRCUIT HAVING SELF-DIAGNOSIS TEST FUNCTION AND TEST METHOD THEREOF

BACKGROUND OF THE INVENTION

The present invention relates to a semiconductor integrated circuit provided with a self-diagnosis test circuit function and the test method of the semiconductor integrated circuit, particularly relates to an effective test circuit for a burn-in test and its test method.

In a burn-in test which is one of a reliability test of a semiconductor integrated circuit, an internal circuit is operated in a state close to actual operation and stress is applied, however, as a conventional burn-in test was made for a packaged finished product, a method of inputting a required input signal to a pin from an external signal supply unit and operating an internal circuit was taken.

However, recently, the technique of wafer level burn-in by which a great many semiconductor integrated circuits can be simultaneously tested is also being established and the need for the test of a semiconductor integrated circuit having a great many pins increases. In the case of a test depending upon external connection, the number of pins which can be used for input is limited, compared with a burn-in test of a conventional type packaged product and therefore, a method of applying stress to a circuit by providing a pseudo-random number generating circuit inside and making scan using the output signal as an input signal including a scan chain is proposed.

However, according to the method, appropriate stress cannot be applied to an I/O cell except a pin used for input of an external signal supply unit and a pin from which an output signal of the final section of a scan chain is output.

There is a method of providing an output determination circuit to a circuit provided with a scan function and checking whether appropriate stress is applied in a burn-in test or not. However, in a method of operating CPU according to an instruction written in test ROM and applying stress to an asynchronous circuit and a memory cell respectively without a scan function, a case that appropriate stress is not applied because of a malfunction of test ROM and others cannot be discriminated from a case that appropriate stress is applied.

SUMMARY OF THE INVENTION

The invention is made in view of the actual situation and provides a test circuit for a semiconductor integrated circuit and its test method wherein appropriate stress can be applied to all I/O cells only by adding a slight circuit in a test.

The invention also provides a test circuit for a semiconductor integrated circuit and its test method wherein it can be further checked whether appropriate stress is applied to an asynchronous circuit and a memory cell respectively without a scan function or not.

A semiconductor integrated circuit provided with a first self-diagnosis test circuit function according to the invention is based upon a semiconductor integrated circuit provided with CPU and is characterized in that it is provided with a port signal output setting register that outputs a high level and a low level to an I/O cell in a test according to test ROM in which instructions for operating CPU in a test mode are written.

According to the circuit configuration, in case an internal circuit is made to scan to apply stress in a test such as a burn-in test, appropriate stress can be also applied to an I/O cell except a pin used for input from an external signal supply unit and a pin to which an output signal of the final section of a scan chain is output.

A second aspect of the invention is based upon the semiconductor integrated circuit provided with a self-diagnosis test circuit function according to the first aspect of the invention and is characterized in that a semiconductor integrated circuit is provided with a port signal output setting register that outputs a high level and a low level to all I/O cells.

According to such configuration, a self-diagnosis test can be easily made to all I/O cells.

A third aspect of the invention is based upon the semiconductor integrated circuit provided with a self-diagnosis test circuit function according to the first aspect of the invention and is characterized in that in a semiconductor integrated circuit, ROM in which instructions for operating CPU are written is also connected to an I/O cell provided with a port signal output setting register in a test mode and a port signal output setting register that outputs a high level and a low level only for a test is provided to an I/O cell not provided with the port signal output setting register.

According to such configuration, all I/O cells are provided with the port signal output setting register and a self-diagnosis test can be easily made to all the I/O cells.

A fourth aspect of the invention is based upon a semiconductor integrated circuit provided with the self-diagnosis test circuit function according to the first aspect of the invention and is characterized in that a test is a burn-in test.

As in the burn-in test, heat treatment for a long time was performed under high temperature, it was extremely difficult to execute a probe test for all pins under high temperature and it was heretofore extremely difficult to execute the test for all I/O cells, however, according to such configuration, a burn-in test can be easily executed.

A fifth aspect of the invention is based upon a semiconductor integrated circuit provided with CPU and is characterized in that a test process in which appropriate stress is applied to all I/O cells by sending an instruction for operating CPU in a test mode and inputting/outputting a test signal including a high level and a low level to/from all the I/O cells is included.

Though it is impossible to test all I/O cells by a conventional type method, according to such configuration according to the invention, a self-diagnosis test can be executed for all I/O cells. Therefore, in any environment such as in a burn-in test, a test can be extremely easily executed.

A sixth aspect of the invention is based upon the test method of the semiconductor integrated circuit according to the fifth aspect of the invention and is characterized in that the test method includes a test process in which appropriate stress is applied to an I/O cell by sending an instruction for operating CPU via test ROM in a test mode in a semiconductor integrated circuit provided with CPU and inputting/outputting a high level and a low level from/to a port signal output setting register to/from the I/O cell.

According to such configuration, a test can be extremely easily executed.

A seventh aspect of the invention is based upon the semiconductor integrated circuit provided with the self-diagnosis test circuit function according to the first aspect of the invention and is characterized in that a semiconductor integrated circuit provided with CPU is provided with test ROM in which instructions for operating CPU in a test mode are written and a circuit for determining whether test ROM is correctly operated to the end in a test or not by writing an instruction for setting a flag in a test ROM determination register in a final part of the test ROM and outputting the flag to an external terminal.

According to such configuration, in the case of a burn-in test, as it can be judged whether stress is actually applied or not after a test process for a long time is finished, the result of the test can be verified. Also, according to this circuit configuration, it can be checked whether stress is correctly applied or not even if CPU is operated and stress is applied to an asynchronous circuit and a memory cell respectively without a scan function according to an instruction written to test ROM.

An eighth aspect of the invention is based upon the semiconductor integrated circuit provided with the self-diagnosis test circuit function according to the seventh aspect of the invention and is characterized in that even if a flag of the test ROM determination register is fixed because of any cause in a test, the register composed of plural bits is provided so that it can be determined whether test ROM is correctly operated to the end or not.

According to this circuit configuration, even if a flag of the test ROM determination register is fixed because of any cause in a test such as a burn-in test, it can be determined whether test ROM is correctly operated to the end or not.

DETAILED DESCRIPTION OF THE PREFERRED EMBODIMENT

Embodiments of the invention will be described below with reference to the drawings.

First Embodiment

Figure 1:
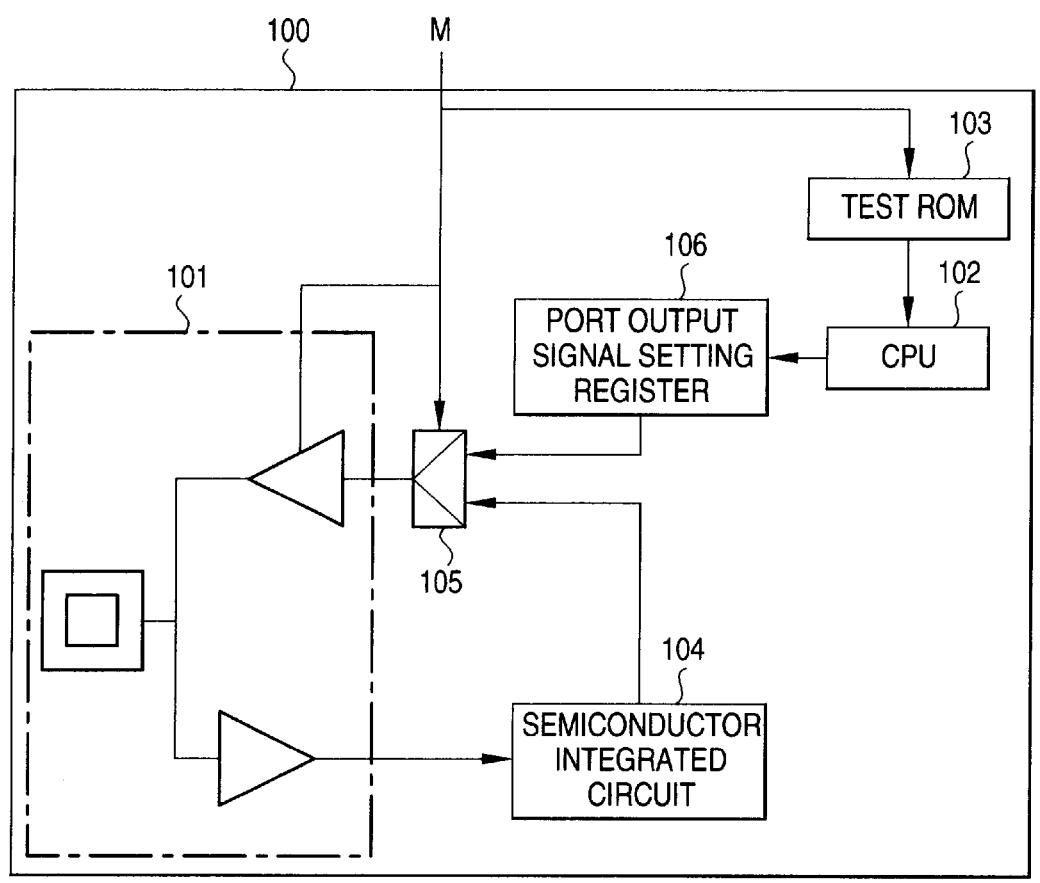
FIG. 1 shows the circuit configuration of the main part of a test circuit of a semiconductor integrated circuit in a first embodiment of the invention.

FIG. 1 is a circuit diagram showing a test circuit of a semiconductor integrated circuit in a first embodiment of the invention.

A semiconductor integrated circuit (chip) 100 has a self-diagnosis test function of an I/O cell 101. The semiconductor integrated circuit includes a CPU 102, a test ROM 103 in which instructions for operating the CPU 102 in a burn-in test mode are written, and a port signal output setting register 106 that outputs "H" and "L" to the I/O cell 101 in a test according to the test ROM 103. As shown in FIG. 1, a reference number 101 denotes an I/O cell wherein the switching of input/output is enabled, 104 denotes a semiconductor integrated circuit inside the chip and 105 denotes an output signal selecting circuit.

That is, this semiconductor integrated circuit is provided with the I/O cell 101, the switching of the input/output of which is enabled in accordance with a setting of a mode, and the test ROM 103 in which instructions for operating the CPU 103 in a burn-in test mode are written. As for this I/O cell 101, in a normal mode, input signal to the inside semiconductor integrated circuit 104 is input from an external device or an output signal from the semiconductor integrated circuit 104 is output to an external device. In a burn-in test, the I/O cell 101 becomes an output state according to a burn-in test mode signal M and in the output signal selecting circuit 105, the output of the port output signal setting register 106 is selected. In the test ROM 102, instructions for periodically alternately setting "H" and "L" in the port output signal setting register 106 are written.

Figure 2:
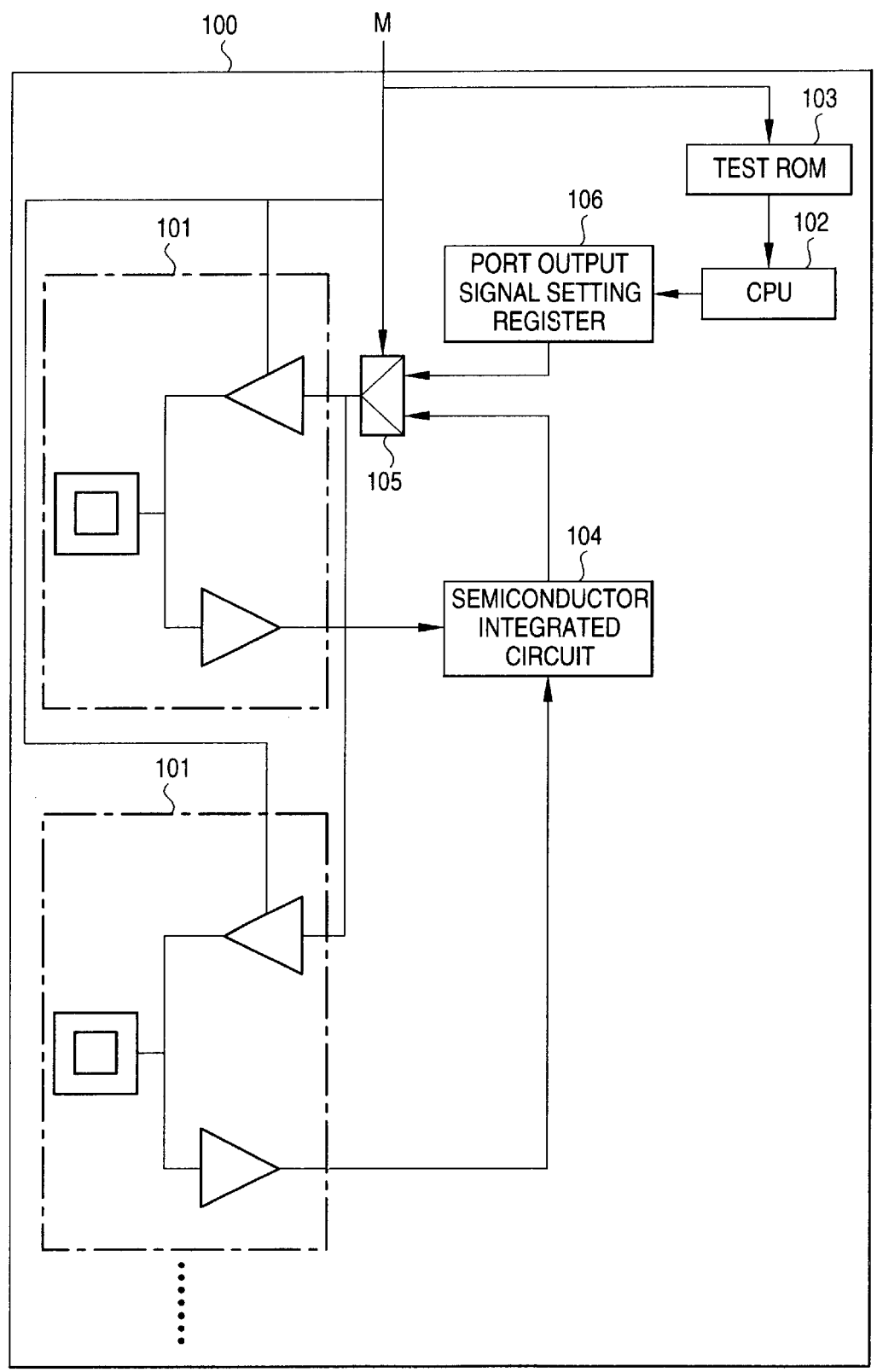
FIG. 2 shows the circuit configuration of the test circuit of the semiconductor integrated circuit in the first embodiment of the invention.

According to this circuit configuration, in burn-in, "H" and "L" are alternately output from the I/O cell 101 and appropriate stress can be applied to the I/O cell 101. In this circuit configuration described above as shown in FIG. 1, one I/O cell is described. However, as shown in FIG. 2, as all I/O cells on the chip can have the similar configuration. Further, since the port output signal setting register 106 may be common to all the I/O cells, it is enough to provide only one port output signal setting register on the chip.

Next, a test process using the semiconductor integrated circuit will be described.

Multiple semiconductor wafers on each of which desired semiconductor integrated circuits are mounted are prepared at a predetermined interval and are installed in an oven in high temperature environment of 140° C. determined beforehand. In this state, a test instruction signal M is sent to the test ROM 103 to change to a self-diagnosis test mode. Stress is automatically applied to the whole device including all I/O cells by leaving in this state for eight hours. A defective product is selected by burn-in and the burn-in test is completed. As described above, after the test is completed, only non-defective products are shipped.

In normal use, the port output signal setting register 106 is not used in this embodiment.

However, in normal use, the port output signal setting register 106 may be also used.

As described above, according to this embodiment, appropriate stress can be applied to all the I/O cells on the chip in wafer level burn-in by only adding the output signal selecting circuit 105 and the port output signal setting register 106.

Also, the output signal selecting circuit 105 and the port output signal setting register 106 respectively used in circuit operation may be also used for a test.

Further, the test ROM is also used in normal circuit operation.

Second Embodiment

Next, a second embodiment of the invention will be described.

Figure 3:
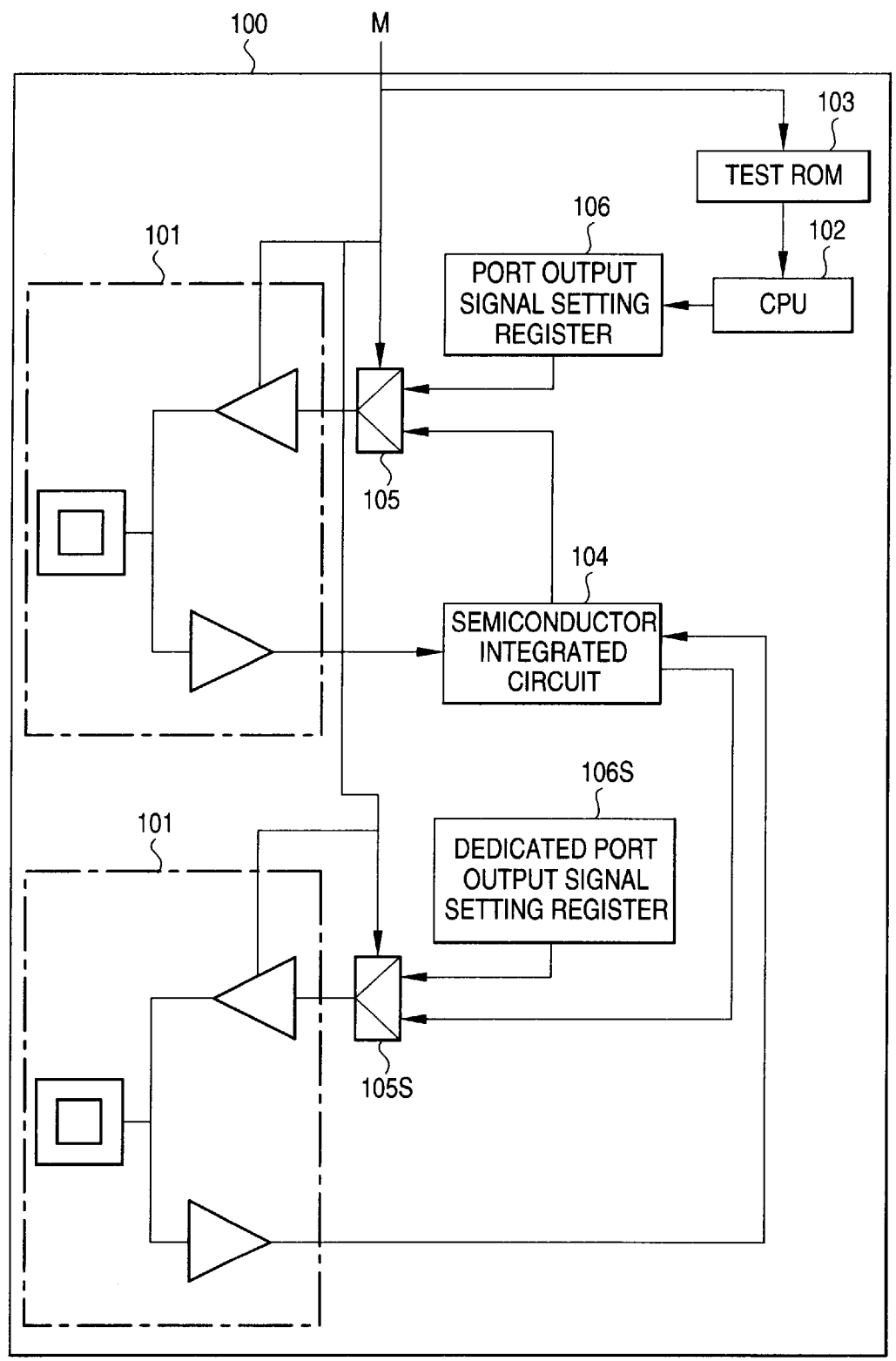
FIG. 3 shows the circuit configuration of a test circuit of a semiconductor integrated circuit in a second embodiment of the invention.

In this embodiment, as shown in FIG. 3, an output signal selecting circuit 105s and a port output signal setting register 106s particularly provided for dedication is effective in addition to the output signal selecting circuit 105 and the port output signal setting register 106 respectively used in normal circuit operation and also used for a test as in the first embodiment.

However, the same reference number is allocated to the same component and the description is omitted.

As described above, for a part of I/O cells, the degree of the freedom of the circuit configuration increases and a securer and more reliable test can be executed by also using the output signal selecting circuit 105s and the port output signal setting register 106s respectively used in normal circuit operation for a test in addition to the output signal selecting circuit 105 and the port output signal setting register 106 respectively particularly provided for dedication.

Third Embodiment

Figure 4:
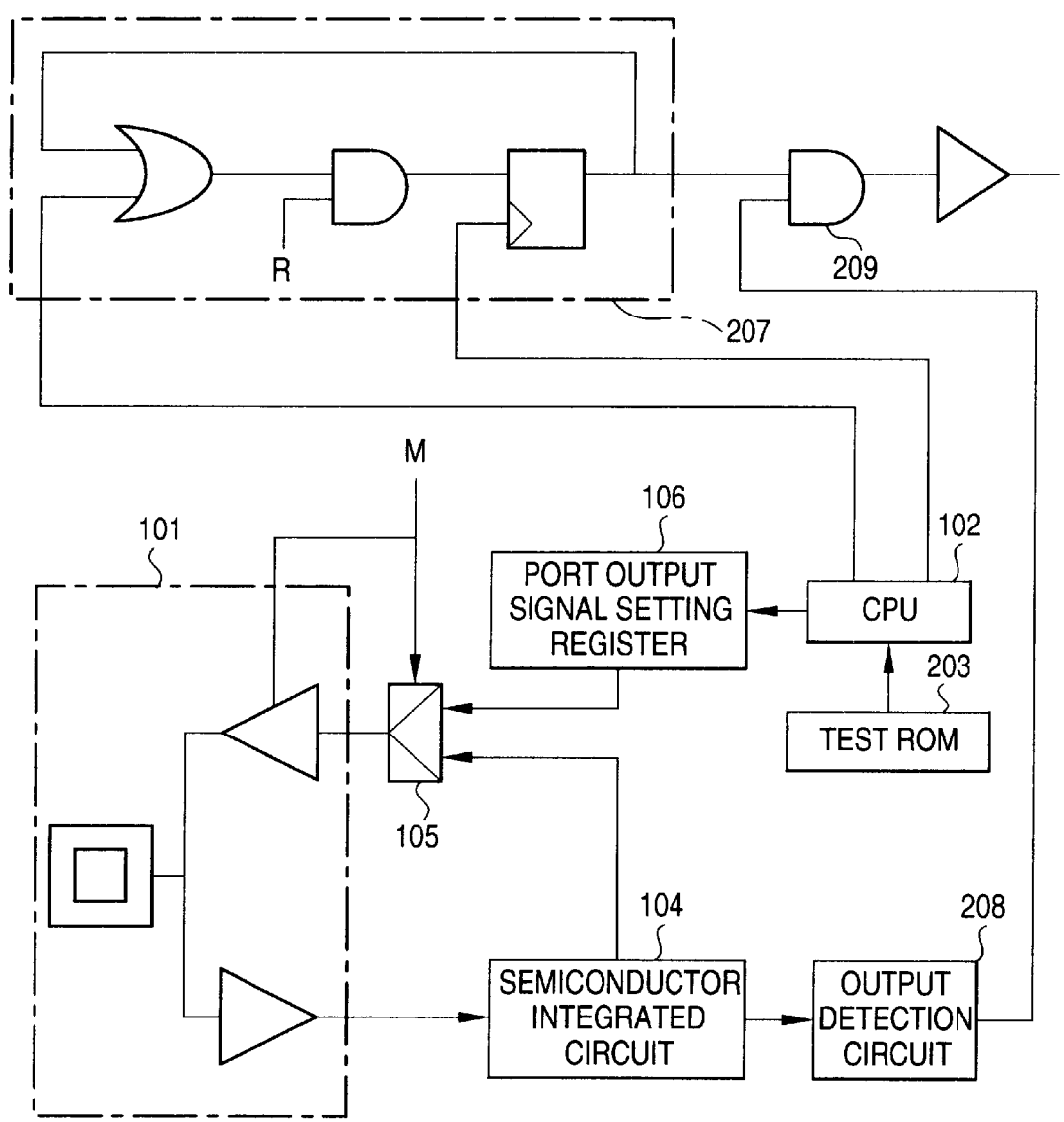
FIG. 4 shows the circuit configuration of a test circuit of a semiconductor integrated circuit in a third embodiment of the invention.

FIG. 4 is a circuit diagram showing a test circuit of a semiconductor integrated circuit in a third embodiment of the invention. The semiconductor integrated circuit includes a test ROM 203 in which instructions for operating the CPU in a test mode are written, further to the semiconductor integrated circuit in the first embodiment. In the test ROM 203, an instruction for setting a flag in the test ROM determination register is written to final part of the instructions for operating the CPU. Therefore, it can be determined whether the test ROM is correctly operated to the end in a test or not, by outputting the flag to an external terminal.

As shown in FIG. 4, a reference number 203 denotes test ROM operated in a burn-in test mode, 207 denotes a register for determining the operation of the test ROM, 208 denotes an output determination circuit for determining a stress applied state and 209 denotes an AND circuit. The other is similar to that in the first embodiment and the same reference number is allocated to the same component.

In this embodiment, CPU 102 is operated according to an instruction written to the test ROM 203 in a burn-in test and stress is applied to an asynchronous circuit without a scan function and a memory without a self-diagnosis circuit. To check that the test ROM 203 is correctly operated to the end, the resister for determining the test ROM 207 is provided and an instruction for writing a flag "H" to the register for determining the test ROM 207 is written in the end of an instruction to be written to the test ROM 203. This flag is reset only by an external reset signal R to be "L". The flag written to the register is input to the AND circuit 209 together with an output signal from the output determination circuit 208 for determining a stress applied state of a semiconductor integrated circuit 104 including a bistable circuit provided with a scan function, an output signal from the AND circuit 209 is output to an external terminal and it is determined whether the application of stress to the circuit is suitable or not.

As described above, according to this embodiment, it can be determined only by adding the test ROM 203 and the register for determining the operation 207 and writing an instruction for writing a flag to the register for determining the operation 207 in the end of an instruction in the test ROM 203 whether the simultaneous application of stress to not only a synchronous circuit provided with a scan function but an asynchronous circuit without a scan function and a memory cell without a self-diagnosis circuit in a burn-in test is suitable or not.

Also, since the resister for determining the operation 207 is composed by plural bits, it can be determined by inputting the conjunction of all flags to the AND circuit 209 whether the test ROM is correctly operated to the end or not even if any of the flags of the register is fixed to "H" because of any cause in a burn-in test.

As described above, it is enabled to execute a securer burn-in test provided with extremely simple configuration.

In the embodiments described above, the burn-in test is described, however, the present invention is not limited to the burn-in test and it need scarcely be said that the invention can be also applied to a normal test.

Also, in the embodiments described above, the burn-in test in the semiconductor integrated chip is described, however, the invention is not limited to it, can be also applied to a burn-in test at the level of a wafer and batch processing can be also extremely easily executed for a semiconductor integrated circuit provided with multiple pins.

As described above, according to the invention, appropriate stress can be applied to all I/O cells in a burn-in test only by adding a slight circuit.

Also, it can be checked by extremely simple configuration whether stress is also correctly applied to an asynchronous circuit without a scan function and memory cell or not.

What is claimed is:

1. A semiconductor integrated circuit having a self-diagnosis test function comprising:
   an I/O cell;
   a port signal output setting register connected to the I/O cell for outputting one or more of "H" and "L" to the I/O cell in a test;
   a CPU connected to the port signal output setting register;
   a test ROM in which an instruction for operating the CPU in a test mode are written; and
   an output signal selecting circuit for selecting one of a signal from the port signal output setting register and a signal from an inside integrated circuit to be input to the I/O cell.

2. A semiconductor integrated circuit according to claim 1, further comprising one or more additional I/O cells, wherein the port signal output setting register outputs the one or more of "H" and "L" to all of the I/O cells.

3. A semiconductor integrated circuit according to claim 1, further comprising:
   an additional I/O cell not provided with the port signal output setting register; and a port signal output setting register only for a test which outputs one or more of "H" and "L" to the additional I/O cell.

4. A semiconductor integrated circuit according to claim 3, wherein the test ROM in which an instruction for operating the CPU in a normal mode is also written.

5. A semiconductor integrated circuit according to claim 1, wherein the test is a burn-in test.

6. A test method of a semiconductor integrated circuit having a CPU, comprising steps of:
   sending an instruction for operating the CPU in a test mode;
   inputting/outputing a test signal including "H" and "L"; and
   selecting one of said test signal and a signal from an inside integrated circuit to be input to one or more I/O cells;
   wherein stress is applied to the I/O cells during the test.

7. A test method of a semiconductor integrated circuit according to claim 6, wherein the instruction for operating the CPU is sent via a test ROM in a test mode, and wherein the test signal is input/output from/to a port signal output setting register to/from the I/O cell.

8. A test circuit for a semiconductor integrated circuit having a self-diagnosis test function, comprising:
   a test ROM in which instructions for operating a CPU in a test mode and an instruction for setting a flag in a final part of the instructions for operating CPU; and
   a determination circuit for determining whether the test ROM is correctly operated to the end of a test by outputting the flag to the external terminal, wherein the determination circuit includes a register composed of a plurality of bits for determining whether the test ROM is correctly operated to the end of the test regardless of whether the test ROM determination register is fixed in a test.

* * * * *

UNITED STATES PATENT AND TRADEMARK OFFICE
CERTIFICATE OF CORRECTION

PATENT NO. : 6,832,348 B2
DATED : December 14, 2004
INVENTOR(S) : Kawabe et al.

It is certified that error appears in the above-identified patent and that said Letters Patent is hereby corrected as shown below:

<u>Title page,</u>
Item [56], References Cited, U.S. PATENT DOCUMENTS, please insert the following;
-- 5,961,653  10/1999  Kalter et al. ………..714/7
   6,028,443  2/2000  Ozaki …………….326/16 --.
FOREIGN PATENT DOCUMENTS, please insert the following;
-- JP       63-295980     12/1988
   JP       01-1211945    5/1989
   JP       10-115662     5/1998 --.

Item [57], ABSTRACT,
Line 1, please delete "(101)".
Line 3, please delete "(106)".
Line 4, please delete "(105)".
Line 6, please delete "(106)".
Line 7, please delete "(103)".
Line 8, please delete "(101)".
Line 9, please delete "(101)".

Signed and Sealed this

Tenth Day of May, 2005

JON W. DUDAS
*Director of the United States Patent and Trademark Office*